United States Patent
Mercier et al.

(10) Patent No.: US 12,120,892 B2
(45) Date of Patent: Oct. 15, 2024

(54) ORGANIC-INORGANIC HYBRID PEROVSKITES

(71) Applicants: UNIVERSITÉ D'ANGERS, Angers (FR); CENTRE NATIONAL DE LA RECHERCHE SCIENTIFIQUE, Paris (FR); CHIMIE PARISTECH, Paris (FR)

(72) Inventors: Nicolas Mercier, Feneu (FR); Antonin Leblanc, La Meignanne (FR); Thierry Pauporté, Vincennes (FR)

(73) Assignees: UNIVERSITÉ D'ANGERS, Angers (FR); CENTRE NATIONAL DE LA RECHERCHE SCIENTIFIQUE (CNRS), Paris (FR); CHIMIE PARISTECH, Paris (FR)

( * ) Notice: Subject to any disclaimer, the term of this patent is extended or adjusted under 35 U.S.C. 154(b) by 1222 days.

(21) Appl. No.: 16/632,582

(22) PCT Filed: Jul. 19, 2018

(86) PCT No.: PCT/FR2018/051840
§ 371 (c)(1),
(2) Date: Jun. 18, 2020

(87) PCT Pub. No.: WO2019/016476
PCT Pub. Date: Jan. 24, 2019

(65) Prior Publication Data
US 2021/0070776 A1 Mar. 11, 2021

(30) Foreign Application Priority Data
Jul. 20, 2017 (FR) ........................................ 1756883

(51) Int. Cl.
*H10K 30/15* (2023.01)
*C07F 7/24* (2006.01)
*H01L 31/0216* (2014.01)
*H01L 31/0256* (2006.01)
*H10K 30/10* (2023.01)
(Continued)

(52) U.S. Cl.
CPC ............. *H10K 30/151* (2023.02); *C07F 7/24* (2013.01); *H01L 31/02167* (2013.01); *H01L 31/0256* (2013.01); *H10K 30/10* (2023.02); *H01L 2031/0344* (2013.01); *H10K 50/15* (2023.02);
(Continued)

(58) Field of Classification Search
None
See application file for complete search history.

(56) References Cited

U.S. PATENT DOCUMENTS

2015/0340632 A1* 11/2015 Etgar .................. H01L 51/0077 438/93
2017/0358757 A1* 12/2017 Lee ...................... C01G 21/006

FOREIGN PATENT DOCUMENTS

KR 20160055090 A * 5/2016 ........... C07C 211/04

OTHER PUBLICATIONS

Eperon et al., Mater. Horiz., 2016, No. 3, pp. 63-71. (Year: 2016).*
(Continued)

*Primary Examiner* — Eli S Mekhlin
(74) *Attorney, Agent, or Firm* — CANTOR COLBURN LLP

(57) ABSTRACT

The application relates to organic-inorganic hybrid perovskites of formula (I): $[(A)_{1-2.48p-b}(B)_{3.48p+b}]_{(1+2p-y)/1+p)}(Pb)_{1-p-m}(M)_m(X^1)_{3-y-q}(X^2)_q(I)$, and perovskite photovoltaic cells comprising the same.

19 Claims, 1 Drawing Sheet

(51) Int. Cl.
  *H10K 50/15* (2023.01)
  *H10K 50/16* (2023.01)
  *H10K 102/10* (2023.01)

(52) U.S. Cl.
  CPC ....... *H10K 50/16* (2023.02); *H10K 2102/102* (2023.02)

(56) References Cited

OTHER PUBLICATIONS

C.I. Covaliu, "Electrical properties of new organo-inorganic layered perovskites", Optoelectronics and Advanced Materials—Rapid Communications, vol. 5, No. 10, Oct. 2011, p. 1097-1102.

Duyen H. Cao, "2D Homologous Perovskites as Light-Absorbing Materials for Solar Cell Applications" ACS Publications, 2015 American Chemical Society.

International Search Report for corresponding application PCT/FR2018/051840 file Jul. 19, 2018; Mail date Oct. 30, 2018.

Jianfeng Lu, "Diammonium and Monoammonium Mixed-Organic-Cation Perovskites for High Performance Solar Cells with Improved Stability", Advanced Energy Materials, 2017, XP002778824.

Written Opinion for corresponding application PCT/FR2018/051840 file Jul. 19, 2018; Mail date Oct. 30, 2018.

Xiaopeng Zheng, "Defect passivation in hybrid perovskite solar cells using quaternary ammonium halid anions and cations", Nature Energy, Jun. 26, 2017.

Jianfeng Lu, "Diammonium and Monoammonium Mixed-Organic-Cation Perovskites for High Performance Solar Cells with Improved Stability", Copyright WILEY-VCH Verlag Gmbh & Co. KGaA, 69469 Weinheim, Germany, 2017.

Jing Cao, "Thiols as interfacial modifiers to enhance the performance and stability of perovskite solar cells", The Royal Society of Chemistry 2015.

Ju Chenggong, "Organolead Halide Perovskite Solar Cells", Progress in Chemistry, 2016, 28( 2/3) : 219-231.

Longfei Ruan, "Stable and Conductive Perovskites Materials Facilitated by X-type Ligands", Electronic Supplementary Material (ESI) for Nanoscale. The Royal Society of Chemistry 2017.

\* cited by examiner

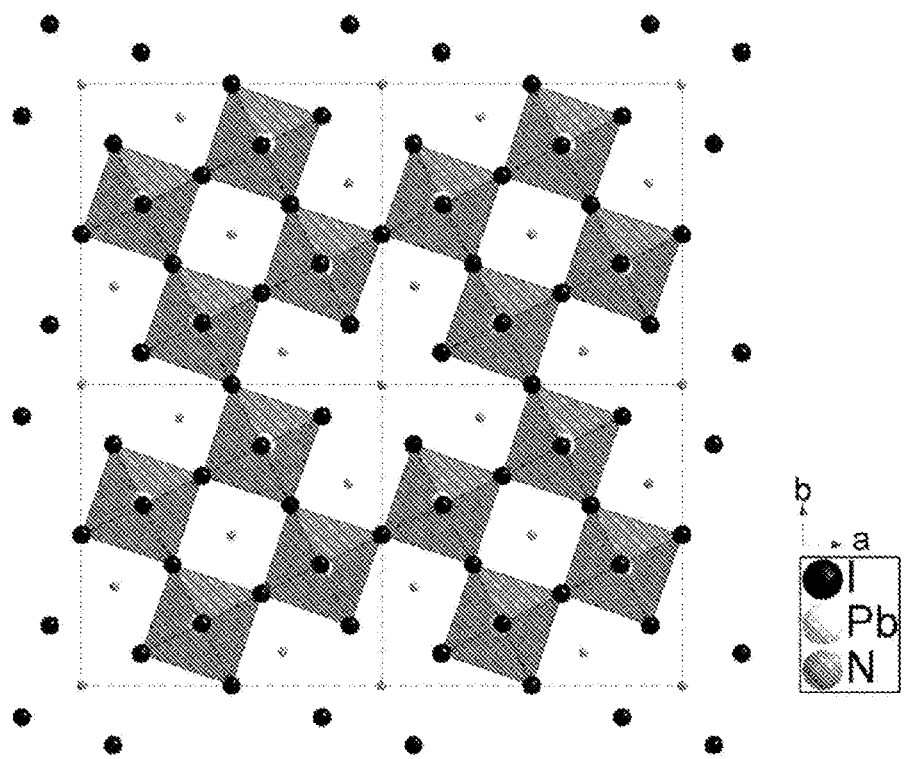

ORGANIC-INORGANIC HYBRID PEROVSKITES

The present invention relates to organic-inorganic hybrid perovskites, and to the uses thereof for preparing solar cells.

The name perovskite originally denotes the mineral $CaTiO_3$ (calcium titanate). Many oxides of formula $ABO_3$ adopt a perovskite-type structure. Organic-inorganic hybrid perovskites $ABX_3$ were developed for photovoltaic applications. MAPI, of formula $(CH_3NH_3)PbI_3$, is a three-dimensional (3D) organic-inorganic hybrid perovskite which revolutionized the photovoltaic sector on account of the high conversion yield of perovskite solar cells (PSCs) (>20%) and the low cost of manufacture of these cells. However, this material has two major drawbacks: the presence of lead, which is a toxic element, and the instability of this hybrid perovskite to moisture.

Alternative perovskites were prepared in order to limit the presence of lead:
  by replacing the lead ($Pb^{2+}$) with tin ($Sn^{2+}$), leading to a perovskite $(CH_3NH_3)(Pb)_{1-x}(Sn)_xI_3$, but the photovoltaic conversion yields are low;
  by replacing the lead ($Pb^{2+}$) with $Ag^+$ and $Bi^{3+}$ ($2Pb^{2+} \Leftrightarrow Ag^+ + Bi^{3+}$), but the yields are also low.

In order to improve the stability to moisture, the most efficient strategy concerns the very design of the cell. Specifically, the manufacture of cells of inverse type protects the MAPI layer from moisture, more than in the direct-type configuration. Another strategy consists in using two-dimensional (2D) hybrid perovskites (for example $(C_6H_5\text{-}EtNH_3)_2(MeNH_3)_2[Pb_3I_{10}]$, $(BA)_2(MeNH_3)_2[Pb_3I_{10}]$ or $(BA)_2(MeNH_3)_3[Pb_4I_{13}]$, in which BA represents butylammonium), which, when the orientation of the thin film is appropriate, have suitable photovoltaic yields (12%) and improved stability.

Various other replacements on MAPI have been reported in the literature:
  by replacing the cation $CH_3NH_3^+$ ($A^+$) with another cation $A'^+$, leading to a solid solution $(A)_{1-x}(A')_xPbI_3$,
  by replacing the anion, leading to perovskites of formula $(CH_3NH_3)Pb(I)_{3-x}(X')_x$ in which X' represents Cl or Br,
  by replacing both the cation and the anion.

The development of alternative perovskites comprising less lead and/or which are more stable to moisture than MAPI, while at the same time conserving high conversion yields, is thus required.

To this end, according to a first subject, the invention relates to an organic-inorganic hybrid perovskite of formula (I) below:

$$[(A)_{1-2.48p-b}(B)_{3.48p+b}]_{(1+2p-y)/(1+p)}(Pb)_{1-p-m}(M)_m (X^1)_{3-y-q}(X^2)_q \quad (I)$$

in which:
  A represents a cation chosen from Cs, Rb and a monovalent organic cation comprising an ammonium or carboxamidamidium group,
  B represents a monovalent organic cation of formula (II) below:

$$R^1\text{—}(CH_2)_2\text{—}R^2 \quad (II)$$

in which:
    $R^2$ represents an ammonium or carboxamidamidium group,
    z represents 1, 2 or 3, and
    $R^1$ represents —H, —OH, —SH, —CN or a halogen, with the proviso that B is other than A,
  $X^1$ and $X^2$ represent a halide, with the proviso that $X^1$ and $X^2$ are different from each other, p is a number greater than 0 and less than or equal to 0.30,
b is a number greater than or equal to −0.30 and less than or equal to 0.30, with the proviso that b is greater than −3.48p and is less than (1−2.48p),
y represents a number greater than 0 and less than or equal to p,
q represents a number greater than or equal to 0 and less than or equal to (3−y),
M represents a divalent metal cation, and
m represents a number greater than or equal to 0 and less than or equal to (1−p).

In the present patent application, the term "greater than a number X" or "less than a number X" means that the number X is excluded.

The invention consists in replacing $Pb^{2+}$, $I^-$ and $MA^+$ ions of MAPI perovskite with organic cations $B^+$. The perovskite according to the invention is necessarily deficient in lead since p is other than 0. The perovskite according to the invention necessarily comprises the species B, since b is greater than −3.48p. Consequently, the amount of lead per unit volume is less in the perovskites according to the invention relative to MAPI, while at the same time conserving the three-dimensional structure of MAPI. Moreover, the stability to moisture appears to be at least comparable, or even improved, relative to the stability to moisture observed for MAPI.

In general, a perovskite lattice is a lattice of $MX_6$ octahedra linked via apices. In "2D" hybrid perovskites, this connection via apices extends in two directions of space (two dimensions). Advantageously, in the perovskites according to the invention, like in the compound $(CH_3NH_3)PbI_3$, the octahedra are connected via apices in the three directions of space (three dimensions).

BRIEF DESCRIPTION OF DRAWINGS

As an illustration, the attached figure is a scheme of the inorganic lattice (Pb and I atoms shown) and of nitrogen atoms of an organic-inorganic hybrid perovskite according to the invention of formula (X) below (which corresponds to formula (I) in which p=y=0.2; m=q=b=0; A=MA=$MeNH_3^+$; B represents HO—$(CH_2)_2$—$NH_3^+$):

$$(MA)_{0.504}(HO\text{—}(CH_2)_2\text{—}NH_3^+)_{0.696}Pb_{0.8}I_{2.8} \quad (X)$$

The lattice of this perovskite is deficient in $(PbI)^+$ species relative to the lattice of a perovskite $(MA)_{1.5}Pb_5I_{1.5}$ (which corresponds to MAPI). This deficiency is notably visible in the positions located at the center and in the four corners of the figure, where cavities are visible (containing N in place of Pb and I). For 0<p<0.2, the perovskite is richer in Pb and in I than that of formula (X), and Pb and I are localized in the cavities. For 0.2<p<0.30, the perovskite is less rich in Pb than that of formula (X), and there are more cavities in the lattice than those illustrated in the figure.

In formula (I), the factor $$\frac{1+2p-y}{1+p}$$

makes it possible to ensure the electrical neutrality of the perovskites according to the invention. Specifically, the negative charge borne by the inorganic part Pb(+II)/M(+II)/$X^1(-I)/X^2(-I)$ is: (3−y−q)+q−2(1−p−m)−2m=1+2p−y (when y=p: the negative charge is 1+p). 1+2p−y positive charges provided by the cations A and B are thus required. In parentheses, there are (1+p) cations A and B. The factor $$\frac{1+2p-y}{1+p}$$

thus balances the charge. When y=p, there are (1+p) negative charges and (1+p) cations A+B. When y is less than p, the negative charge increases, more cations are therefore required to compensate, i.e. 1+2p−y.

The inventors have observed that, in the perovskites according to the invention, there is a correlation between p and the number of cations A, on the one hand, and the number of cations B, on the other hand. More precisely:
  the amount of cations B is close to a linear function of p, namely 3.48p, and is within the range (3.48p+b), and
  the amount of cations A is also close to a linear function of p, namely (1−2.48p), and is within the range (1−2.48p−b).

The index b defines a domain on either side of these linear functions.

$X^1$ preferably represents an iodide. The perovskite then has the formula (IIa) below:

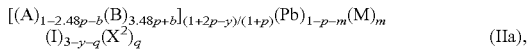  (IIa), in which A, B, p, M, m, b, y and q are as defined above and $X^2$ represents a halide chosen from Br, Cl and F, preferably Br and Cl.

The perovskite may be free of halide other than iodide: $X^1$ then represents an iodide and q represents 0. The perovskite then has the formula (III) below:

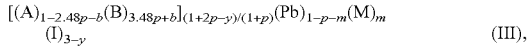  (III), in which A, B, p, M, b, y and m are as defined above.

The perovskite may be free of metal M other than lead: m then represents 0. The perovskite then has the formula (IV) below:

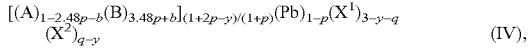  (IV), in which A, B, p, $X^1$, $X^2$, b, y and q are as defined above.

In formula (IV), $X^1$ preferably represents an iodide and the perovskite then has the formula (V) below:

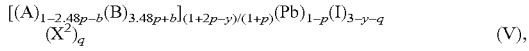  (V), in which A, B, p, b, y and q are as defined above and $X^2$ represents a halide chosen from Br, Cl and F, preferably Br and Cl. This perovskite may be free of halide other than iodide and may have the formula (VI) below:

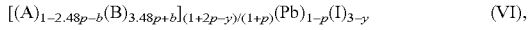  (VI), in which A, B, b, y and p are as defined above.

The following embodiments, considered independently or in combination with each other, are applicable to the above formulae:
  Preferably, y is equal to p.
  Preferably, p is a number greater than 0 and less than or equal to 0.25, notably from 0.01 to 0.25, in particular from 0.05 to 0.23.
  Preferably, b is a number greater than or equal to −0.20 and less than or equal to 0.20, notably a number greater than or equal to −0.10 and less than or equal to 0.10, in particular a number greater than or equal to −0.07 and less than or equal to 0.07.
  Preferably, m represents 0 and/or q represents 0.
  Among the divalent metal cations M, mention may be made of Pb, Sn, Cu, Cd and Mn.

Among the halides $X^1$ and $X^2$, mention may be made of an iodide, a chloride, a bromide or a fluoride, preferably an iodide, a chloride or a bromide.

Among the halogens of the groups $R^1$, mention may be made of an iodine, a chlorine, a bromine or a fluorine, preferably a chlorine, a bromine or a fluorine, fluorine being particularly preferred.

The group $—NH_3^+$ is the preferred ammonium group.

The cation A may be chosen from Cs and Rb.

The cation A may be a monovalent organic cation comprising an ammonium or carboxamidamidium group. The cation A typically comprises (or even is constituted of):
  the ammonium or carboxamidamidium group and
  a hydrogen —H or a hydrocarbon comprising from 1 to 4 carbon atoms, notably one or two carbon atoms, preferably an alkyl such as methyl or ethyl.

Among the monovalent organic cations comprising an ammonium group that are possible for the cation A, mention may be made of methylammonium (MA) of formula $CH_3NH_3^+$. The $—C(NH_2)_2^+$ group is the preferred carboxamidamidium. Formamidinium of formula $HC(NH_2)_2^+$ (FA) is the most common monovalent organic cation comprising a carboxamidamidium group. Preferably, A represents methylammonium (MA) or formamidinium (FA).

The cation A is different from the cation B.

Preferably, in formula (II):
  $R^2$ represents an $—NH_3^+$ group, and/or
  z represents 1 or 2, preferably 2, and/or
  $R^1$ represents —H, —OH, —SH, —CN or a halogen, notably —OH, —SH, —CN or a halogen, in particular —OH or —SH, preferably —OH.

When $R^1$ represents —H, the monovalent organic cation B of formula (II) may be $CH_3CH_2NH_3^+$ or $CH_3C(NH_2)^{2+}$.

When $R^1$ represents —OH, the preferred monovalent organic cation B of formula (II) is $HO—(CH_2)_2—NH_3^+$.

When $R^1$ represents —SH, the preferred monovalent organic cation B of formula (II) is $HS—(CH_2)_2—NH_3^+$.

Particularly preferably, the perovskite has the formula (VII) below:

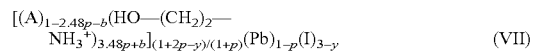  (VII)

in which A, p, b and y are as defined above; preferably, A represents MA and/or y=p.

The perovskites of formulae (90), (92), (89), (93) and (88) below are particularly preferred:

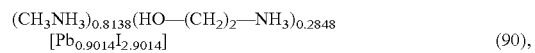  (90), (in formula (I), $A=CH_3NH_3$; $B=HO—(CH_2)_2—NH_3$; m=q=0; y=p=0.0986; b=−0.058328)

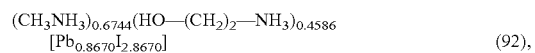  (92), (in formula (I), $A=CH_3NH_3$; $B=HO—(CH_2)_2—NH_3$; m=q=0; y=p=0.133; b=−0.00424)

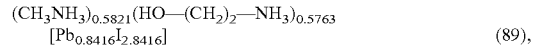  (89), (in formula (I), $A=CH_3NH_3$; $B=HO—(CH_2)_2—NH_3$; m=q=0; y=p=0.1584; b=0.025068)

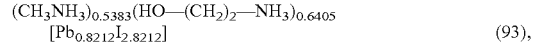  (93), (in formula (I), $A=CH_3NH_3$; $B=HO—(CH_2)_2—NH_3$; m=q=0; y=p=0.1788; b=0.018276) or

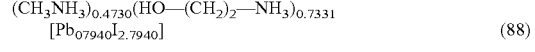  (88)

(in formula (I), A=CH$_3$NH$_3$; B=HO—(CH$_2$)$_2$—NH$_3$; m=q=0; y=p=0.206; b=0.01622).

Particularly preferably, the perovskite has the formula (VIII) below:

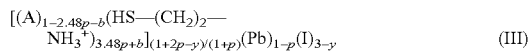

$$[(A)_{1-2.48p-b}(HS-(CH_2)_2-NH_3^+)_{3.48p+b}]_{(1+2p-y)(1+p)}(Pb)_{1-p}(I)_{3-y} \quad (III)$$

in which A, p, b and y are as defined above; preferably, A represents FA and/or y=p.

The perovskite of formula (T1) below is particularly preferred:

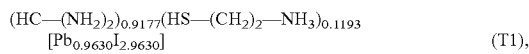

$$(HC-(NH_2)_2)_{0.9177}(HS-(CH_2)_2-NH_3)_{0.1193}[Pb_{0.9630}I_{2.9630}] \quad (T1),$$

(in formula (I), A=HC—(NH$_2$)$_2$; B=HS—(CH$_2$)$_2$—NH$_3$; m=q=0; y=p=0.037; b=−0.00946).

In the present patent application, and as often in perovskite structures, the positive charges of the cations or anions are not always represented. It is understood that Pb corresponds to Pb$^{2+}$, Sn to Sn$^{2+}$, Cu to Cu$^{2+}$, Cd to Cd$^{2+}$, Mn to Mn$^{2+}$, Cs to Cs$^+$ and Rb to Rb$^+$, CH$_3$NH$_3$ to CH$_3$NH$_3^+$, HO—(CH$_2$)$_2$—NH$_3$ to HO—(CH$_2$)$_2$—NH$_3^+$, HC—(NH$_2$)$_2$ to HC—(NH$_2$)$_2^+$, HS—(CH$_2$)$_2$—NH$_3$ to HS—(CH$_2$)$_2$—NH$_3^+$.

The perovskites according to the invention may be in various forms, notably in the form of crystalline powder or of crystals. They have a three-dimensional structure, like MAPI. Generally, the perovskites according to the invention have a crystalline system of tetragonal symmetry, like MAPI.

The perovskites may also be in the form of a thin layer at least partly covering the surface of a substrate. This surface is, for example, the surface of an electron-transporting material. For example, the substrate is glass covered with a layer of fluorine-doped tin oxide (FTO) or with a layer of indium tin oxide (ITO) onto which has been deposited at least one electron transport layer (ETL) such as TiO$_2$, SnO$_2$ or ZnO.

According to a second subject, the invention relates to a process for preparing the perovskites defined above.

They may be prepared by applying the MAPI preparation processes by analogy, except for introducing a salt whose cation is B as defined above. Typically, to obtain perovskites in the form of crystals/crystalline powder, the following methods may be used:

evaporation of a supersaturated solution comprising:
  a salt whose cation is A as defined above,
  a salt whose cation is B as defined above,
  a lead halide, and
  optionally a halide of a divalent metal cation M,
addition of a nonsolvent to such a supersaturated solution, or
a solvothermal method.

Adaptation of the [salt whose cation is A as defined above/salt whose cation is B as defined above/lead halide/optionally a halide of a divalent metal cation M] molar proportions makes it possible to obtain perovskites with different p, q and m values.

To obtain perovskites in the form of a thin layer on the surface of a substrate, various methods may be used:
  spin coating on the surface of a substrate,
  deposition by diffusion of solvent on the surface of a substrate, followed by annealing, or
  deposition by solid-state pressurization.

Advantageously, the organic-inorganic hybrid perovskites according to the invention have photovoltaic yields comparable to that of MAPI. They are thus particularly suitable for use in solar cells.

According to a third subject, the invention relates to a perovskite solar cell (PSC), at least one of the layers of which contains the perovskite defined above.

The architecture of the solar cell may be planar of n-i-p or p-i-n type, mesoporous or bilayer (typically a layer comprising the perovskite according to the invention and a layer of silicon).

The examples that follow and the attached figure illustrate the invention. The figure represents a scheme of the inorganic lattice (Pb, I and N atoms represented) of an organic-inorganic hybrid perovskite of formula (X) below:

$$(MA)_{0.452}(B)_{0.748}Pb_{0.8}I_{2.8} \quad (X)$$

The perovskites having the following formulae were prepared in the examples:

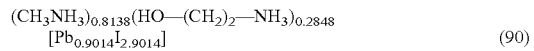

$$(CH_3NH_3)_{0.8138}(HO-(CH_2)_2-NH_3)_{0.2848}[Pb_{0.9014}I_{2.9014}] \quad (90)$$

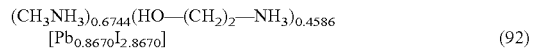

$$(CH_3NH_3)_{0.6744}(HO-(CH_2)_2-NH_3)_{0.4586}[Pb_{0.8670}I_{2.8670}] \quad (92)$$

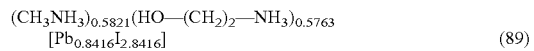

$$(CH_3NH_3)_{0.5821}(HO-(CH_2)_2-NH_3)_{0.5763}[Pb_{0.8416}I_{2.8416}] \quad (89)$$

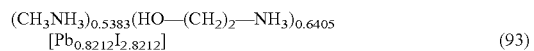

$$(CH_3NH_3)_{0.5383}(HO-(CH_2)_2-NH_3)_{0.6405}[Pb_{0.8212}I_{2.8212}] \quad (93)$$

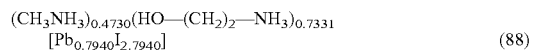

$$(CH_3NH_3)_{0.4730}(HO-(CH_2)_2-NH_3)_{0.7331}[Pb_{0.7940}I_{2.7940}] \quad (88)$$

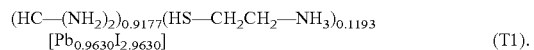

$$(HC-(NH_2)_2)_{0.9177}(HS-CH_2CH_2-NH_3)_{0.1193}[Pb_{0.9630}I_{2.9630}] \quad (T1).$$

EXAMPLE 1: PREPARATION OF PEROVSKITES IN THE FORM OF CRYSTALS/CRYSTALLINE POWDERS

In a first stage, a precursor solution close to saturation was prepared by dissolving ethanolamine, methylammonium iodide and PbI$_2$ in 57% hydriodic acid solution (Aldrich compounds). The ethanolamine/methylammonium iodide/PbI$_2$ molar proportions were 1/2/3, 1.5/2/3, 2/2/3, 2.5/2/3 and 3/2/3, for perovskites 90, 92, 89, 93 and 88, respectively.

In a second stage, this precursor solution was added to ethyl acetate, leading to immediate precipitation of the perovskite. The powder obtained was filtered, washed with ethyl acetate and then dried in an oven for 15 to 20 minutes at 80° C.

The crystalline powder obtained was analyzed by nuclear magnetic resonance (NMR) and X-ray (XR).

Perovskite 88—NMR (DMSO-de). Description:
  1 signal at 2.39 ppm with an integration of 3H, associated with the methyl of the methylammonium ligand
  1 signal at 2.87 ppm with an integration of 3.09H, associated with one —CH$_2$— of the ethanolammonium ligand
  1 signal at 3.58 ppm with an integration of 3.15H, associated with the second —CH$_2$— of the ethanolammonium ligand
  1 broad and weak signal at 5.13 ppm with an integration of 1.55H, associated with the HO— of the ethanolammonium ligand
  1 very broad signal at 7.67 ppm with an integration of 7.71 ppm, associated with the ammonium functions of the two ligands Perovskite 93—NMR (DMSO-de). Description:
  1 signal at 2.39 ppm with an integration of 3H, associated with the methyl of the methylammonium ligand 1 signal at 2.87 ppm with an integration of 2.35H, associated with one —CH$_2$— of the ethanolammonium ligand 1 signal at 3.58 ppm with an integration of 2.41H, associated with the second —CH$_2$— of the ethanolammonium ligand 1 broad and weak signal at 5.13 ppm with an integration of 1.19H, associated with the HO— of the ethanolammonium ligand 1 very broad signal at 7.61 ppm with an integration of 6.49 ppm, associated with the ammonium functions of the two ligands Perovskite 89—NMR (DMSO-de). Description:

1 signal at 2.39 ppm with an integration of 3H, associated with the methyl of the methylammonium ligand 1 signal at 2.87 ppm with an integration of 1.98H, associated with one —CH$_2$— of the ethanolammonium ligand 1 signal at 3.58 ppm with an integration of 1.99H, associated with the second —CH$_2$— of the ethanolammonium ligand 1 broad and weak signal at 5.14 ppm with an integration of 0.99H, associated with the HO— of the ethanolammonium ligand 1 very broad signal at 7.60 ppm with an integration of 5.90 ppm, associated with the ammonium functions of the two ligands Perovskite 92—NMR (DMSO-de). Description:

1 signal at 2.38 ppm with an integration of 3H, associated with the methyl of the methylammonium ligand 1 signal at 2.87 ppm with an integration of 1.38H, associated with one —CH$_2$— of the ethanolammonium ligand 1 signal at 3.57 ppm with an integration of 1.34H, associated with the second —CH$_2$— of the ethanolammonium ligand 1 broad and weak signal at 5.11 ppm with an integration of 0.68H, associated with the HO— of the ethanolammonium ligand 1 very broad signal at 7.60 ppm with an integration of 5.27 ppm, associated with the ammonium functions of the two ligands Perovskite 90—NMR (DMSO-de). Description:

1 signal at 2.39 ppm with an integration of 3H, associated with the methyl of the methylammonium ligand 1 signal at 2.88 ppm with an integration of 0.69H, associated with one —CH$_2$— of the ethanolammonium ligand 1 signal at 3.58 ppm with an integration of 0.71H, associated with the second —CH$_2$— of the ethanolammonium ligand 1 broad and weak signal at 5.12 ppm with an integration of 0.35H, associated with the HO— of the ethanolammonium ligand 2 broad overlapping signals at 7.50 and 7.68 ppm, with a total integration of 4.12 ppm, associated with the ammonium functions of the two ligands Powder XR study (Bruker D8 Avance diffractometer, copper anticathode, Vantec detector)

Positions 2θ in ° of the diffraction lines of the compounds in the angular range 5-32°

Perovskite 88: 6.235; 8.772; 12.412; 13.895; 18.745; 19.690; 22.379; 24.125; 25.669; 27.820; 28.768; 29.418; 31.241

Perovskite 93: 6.254; 8.810; 12.421; 13.905; 17.674; 18.745; 19.773; 22.494; 24.194; 24.981; 25.746; 27.896; 28.768; 29.380; 31.275

Perovskite 89: 8.896; 12.543; 14.012; 18.783; 19.820; 22.571; 24.285; 25.784; 28.011; 28.883; 29.533; 31.412

Perovskite 92: 14.092; 19.938; 24.388; 26.014; 28.125; 31.527

Perovskite 90: 13.980; 19.820; 24.297; 25.325; 28.125; 31.534

The perovskites prepared all had a crystalline system of tetragonal symmetry.

For perovskite 88, the lattice parameters are as follows:
$a=b=14.184$ Å,
$c=6.292$ Å
$\alpha=\beta=\gamma=90°$
$V=1266$ Å$^3$ EXAMPLE 2: PREPARATION OF PEROVSKITES IN THE FORM OF A THIN LAYER AND OF A PHOTOVOLTAIC DEVICE The photovoltaic device made consists of a glass support covered with a layer of fluorine-doped tin oxide (FTO) (TEC™ (7)), onto which has been deposited by spraying a first electron transport layer (ETL) of compact TiO$_2$, followed by deposition of a second layer of porous TiO$_2$ by spin coating. The perovskite active layer according to the invention was deposited onto the porous TiO$_2$ by spin coating (solvent: dimethylformamide, 1 molar solution), followed by annealing at 100° C. for 1 hour, and the spiro-OMeTAD hole transport material (HTM) layer was then deposited, also by spin coating. To finish, the silver electrode was deposited by evaporation.

Under conditions not yet optimized, but identical for all the perovskites tested (namely MAPI, perovskite 90, perovskite 92 and perovskite 89), the photovoltaic yield results (PCE) are as follows (the announced value is a mean over 5 to 6 measurements):

| Perovskite | MAPI (comparative) | 90 | 92 | 89 |
|---|---|---|---|---|
| PCE (series 1) | 3.35% | 3.74% | 2.14% | 1.88% |
| PCE (series 2) | 2.97% | 4.02% | 2.44% | 2.07% |

EXAMPLE 3: PREPARATION OF PEROVSKITE T1 IN THE FORM OF A CRYSTALLINE POWDER (NO CRYSTALS)

In a first stage, a precursor solution close to saturation was prepared by dissolving cysteamine, formamidinium iodide and PbI$_2$ in 57% hydriodic acid solution (Aldrich compounds). The cysteamine/formamidinium iodide/PbI$_2$ molar proportions were 2.13/3/3.

In a second stage, this precursor solution was added to ethyl acetate, leading to immediate precipitation of the perovskite. The powder obtained was filtered, washed with ethyl acetate and then dried in an oven for 15 to 20 minutes at 60° C.

The crystalline powder obtained was analyzed by nuclear magnetic resonance (NMR) and X-ray (XR).

Perovskite T1—NMR (DMSO-de). Description:

1 signal at 2.69 ppm with an integration of 0.14H, associated with the hydrogen of the HS— function of the thioethylammonium ligand.

1 signal at 2.96 ppm with an integration of 0.24H, associated with one —CH$_2$— of the thioethylammonium ligand.

1 signal at 3.14 ppm with an integration of 0.24H, associated with the second —CH$_2$— of the thioethylammonium ligand.

1 signal at 7.86 ppm with an integration of 1.38H, associated with the HC-hydrogen of the formamidinium ligand with an integration contribution of 1.00H+ associated with the —NH$_3^+$ of the thioethylammonium ligand with an integration contribution of 0.38H.

1 signal at 8.66 ppm with an integration of 2.00H, associated with one —NH$_2$— of the formamidinium ligand.

1 signal at 9.00 ppm with an integration of 2.00H, associated with the second —NH$_2$— of the formamidinium ligand.

Powder XR study (Bruker D8 Avance diffractometer, copper anticathode, point scintillation detector)
Positions 2θ in ° of the diffraction lines of the compounds in the angular range 5-32° Perovskite T1: 13.949; 19.749; 24.249; 28.069; 31.449; 34.479; 40.089; 42.629; 49.749; 51.819; 58.139

EXAMPLE 4: PREPARATION OF PEROVSKITE T1 IN THIN LAYER FORM

The thin layer was prepared by spin coating under ambient conditions. In a first stage, the solution containing the precursors was prepared by dissolving thioethylammonium iodide/formamidinium iodide/PbI$_2$ in dimethylformamide (DMF), and adhering to stoichiometric proportions of 0.5/3/3. The PbI$_2$ concentration was set at 1.2 mol/L. In a second stage, 60 µL of this solution are deposited onto a 1.5*2 cm$^2$ glass/FTO support (tec7, Pilkington), on the FTO side. The spin-coating program then imposed is 10 seconds at 1000 rpm (acceleration of 200 rpm/second), and then 20 seconds at 6000 rpm (acceleration of 3000 rpm/second). During this program (more precisely at 15 seconds), 300 µL of ethyl acetate or 150 µL of chlorobenzene are added directly to the rotating film. On conclusion of the spin coating, the thin-layer film undergoes a heat treatment on a hotplate at 100° C. for 30 minutes.

Thin Layer Stability

A comparison was made of the stability of perovskite T1 and of the known perovskite α-FAPbI$_3$ (FA$^+$=formamidinium, HC(NH$_2$)$_2^+$) under laboratory conditions (air, light, 25° C., relative humidity of about 80%).

After preparing the films by spin coating, they were left on a bench and X-ray diffraction analyses were performed regularly. The initial X-ray diffraction analysis shows that the thin films prepared correspond to the expected phases (positions 2θ in ° of the diffraction lines of the compounds in the angular range 5-32°: Perovskite T1, 13.949, 19.749, 24.249, 28.069, 31.449; α-FAPbI$_3$, 13.969, 19.767, 24.218, 28.113, 31.510). After 25 hours, the first signs of appearance of the non-perovskite phase δ-FAPI appeared for the sample α-FAPbI$_3$ (line at position 2θ 11.8°), signifying start of degradation.

After 100 hours, whereas the sample of α-FAPbI$_3$ is completely transformed into δ-FAPI, there is no sign of degradation for the sample T1 (X-ray diffractogram identical to the initial one).

The invention claimed is:

1. An organic-inorganic hybrid perovskite of formula (I) below:

$$[(A)_{1-2.48p-b}(B)_{3.48p+b}]_{(1+2p-y)/(1+p)}(Pb)_{1-p-m}(M)_m (X^1)_{3-y-q}(X^2)_q \quad (I)$$

in which:
A represents a cation chosen from Cs, Rb and a monovalent organic cation comprising an ammonium or carboxamidamidium group,
B represents a monovalent organic cation of formula (II) below:

$$R^1-(CH_2)_2-R^2 \quad (II)$$

in which:
R$^2$ represents an ammonium or carboxamidamidium group,
z represents 1, 2 or 3, and
R$^1$ represents —H, —OH, —SH, —CN or a halogen, with the proviso that B is other than A,
X$^1$ and X$^2$ represent a halide, with the proviso that X$^1$ and X$^2$ are different from each other,
p is a number from 0.05 to 0.23,
b is a number greater than or equal to −0.30 and less than or equal to 0.30, with the proviso that b is greater than −3.48p and is less than (1−2.48p),
y represents a number greater than 0 and less than or equal to p,
q represents a number greater than or equal to 0 and less than or equal to (3−y),
M represents a divalent metal cation, and
m represents a number greater than or equal to 0 and less than or equal to (1−p).

2. The perovskite as claimed in claim 1, in which X$^1$ represents an iodide and q represents 0.

3. The perovskite as claimed in claim 1, in which m represents 0.

4. The perovskite as claimed in claim 1, in which:
the divalent metal cation is chosen from Pb, Sn, Cu, Cd and Mn, and/or
the halide is chosen from an iodide, a chloride and a bromide, and/or
the monovalent organic cation A is chosen from Cs, Rb, methylammonium and formamidinium, and/or
y is equal to p, and/or
b is a number greater than or equal to −0.20 and less than or equal to 0.20, and/or
m represents 0, and/or
q represents 0.

5. The perovskite as claimed in claim 4, in which b is a number greater than or equal to −0.10 and less than or equal to 0.10.

6. The perovskite as claimed in claim 4, in which b is a number greater than or equal to −0.07 and less than or equal to 0.07.

7. The perovskite as claimed in claim 1, in which the monovalent organic cation B of formula (II) is HO—(CH$_2$)$_2$—NH$_3^+$.

8. The perovskite as claimed in claim 1, of formula (VII) below:

$$[(A)_{1-2.48p-b}(HO-(CH_2)_2-NH_3^+)_{3.48p+b}]_{(1+2p-y)/(1+p)}(Pb)_{1-p}(I)_{3-y} \quad (VII)$$

in which A, p, b and y are as defined in claim 1.

9. The perovskite as claimed in claim 8, in which A represents CH$_3$NH$_3^+$ and/or y=p.

10. The perovskite as claimed in any one of the preceding claims, of formula (90), (92), (89), (93) or (88) below:

$$(CH_3NH_3)_{0.8138}(HO-(CH_2)_2-NH_3)_{0.2848} [Pb_{0.9014}I_{2.9014}] \quad (90),$$

$$(CH_3NH_3)_{0.6744}(HO-(CH_2)_2-NH_3)_{0.4586} [Pb_{0.8670}I_{2.8670}] \quad (92),$$

$(CH_3NH_3)_{0.5821}(HO-(CH_2)_2-NH_3)_{0.5763}$
$[Pb_{0.8416}I_{2.8416}]$ (89), $(CH_3NH_3)_{0.5383}(HO-(CH_2)_2-NH_3)_{0.6405}$
$[Pb_{0.8212}I_{2.8212}]$ (93), or $(CH_3NH_3)_{0.4730}(HO-(CH_2)_2-NH_3)_{0.7331}$
$[Pb_{07940}I_{2.7940}]$ (88).

11. The perovskite as claimed in claim 1, in which the monovalent organic cation B of formula (II) is $HS-(CH_2)_2-NH_3^+$.

12. The perovskite as claimed in claim 1 of formula (VIII) below:

$[(A)_{1-2.48p-b}(HS-(CH_2)_2-NH_3^+)_{3.48p+b}]_{(1+2p-y)/(1+p)}(Pb)_{1-p}(I)_{3-y}$ (VIII)

in which A, p, b and y are as defined above.

13. The perovskite as claimed in claim 12, in which A represents FA and/or y=p.

14. The perovskite as claimed in claim 1, of formula (T1) below:

$(HC-(NH_2)_2)_{0.9177}(HS-(CH_2)_2-NH_3)_{0.1193}$
$[Pb_{0.9630}I_{2.9630}]$ (T1).

15. The perovskite as claimed in claim 1, in the form of crystals, the crystalline system of which is of tetragonal symmetry.

16. The perovskite as claimed in claim 1, in the form of a thin layer at least partly covering the surface of a substrate.

17. A perovskite solar cell, at least one of the layers of which contains the perovskite as claimed in claim 1.

18. The perovskite as claimed in claim 1, having a three-dimensional structure.

19. The perovskite as claimed in claim 1, in which the monovalent organic cation B of formula (II) is chosen from $CH_3CH_2NH_3^+$, $CH_3C(NH_2)_2^+$, $HO-(CH_2)_2-NH_3^+$ and $HS-(CH_2)_2-NH_3^+$.

* * * * *